United States Patent
Durbin et al.

(10) Patent No.: US 8,362,797 B2
(45) Date of Patent: Jan. 29, 2013

(54) MAINTAINING A WAFER/WAFER TRANSLATOR PAIR IN AN ATTACHED STATE FREE OF A GASKET DISPOSED THEREBETWEEN

(75) Inventors: Aaron Durbin, Portland, OR (US);
Morgan T Johnson, Portland, OR (US);
Jose A Santos, Portland, OR (US)

(73) Assignee: Advanced Inquiry Systems, Inc., Beaverton, OR (US)

( * ) Notice: Subject to any disclaimer, the term of this patent is extended or adjusted under 35 U.S.C. 154(b) by 306 days.

(21) Appl. No.: 12/547,418

(22) Filed: Aug. 25, 2009

(65) Prior Publication Data

US 2011/0050274 A1    Mar. 3, 2011

(51) Int. Cl.
G01R 31/28 (2006.01)
G01R 31/02 (2006.01)
G01R 31/00 (2006.01)

(52) U.S. Cl. ............ 324/763.01; 324/762.01; 324/750.2

(58) Field of Classification Search ............... 324/750.2, 324/756.01–756.02, 757.01–757.03, 762.01, 324/763.01–763.02
See application file for complete search history.

(56) References Cited

U.S. PATENT DOCUMENTS

| | | | |
|---|---|---|---|
| 4,912,399 A | 3/1990 | Greub et al. | |
| 4,975,638 A | 12/1990 | Evans et al. | |
| 5,477,160 A * | 12/1995 | Love | 324/756.02 |
| 5,986,753 A | 11/1999 | Seelig et al. | |
| 6,060,892 A | 5/2000 | Yamagata | |
| 6,168,974 B1 | 1/2001 | Chang et al. | |
| 6,215,320 B1 | 4/2001 | Parrish | |
| 6,433,563 B1 | 8/2002 | Maruyama | |
| 6,445,200 B2 * | 9/2002 | Haseyama | 324/750.09 |
| 6,737,879 B2 * | 5/2004 | Johnson | 324/756.05 |
| 6,836,130 B2 | 12/2004 | Johnson | |
| 6,842,030 B2 | 1/2005 | Kim et al. | |
| 6,991,969 B2 | 1/2006 | Johnson | |
| 7,049,837 B2 | 5/2006 | Kasukabe et al. | |
| 7,055,535 B2 * | 6/2006 | Kunisawa et al. | 134/157 |
| 7,227,370 B2 * | 6/2007 | Kasukabe | 324/754.15 |
| 7,282,931 B2 | 10/2007 | Johnson | |
| 7,456,643 B2 * | 11/2008 | Johnson | 324/756.03 |
| 7,463,049 B2 * | 12/2008 | Arai et al. | 324/762.01 |
| 7,489,148 B2 | 2/2009 | Johnson | |
| 7,498,800 B1 * | 3/2009 | Whiteman | 324/757.03 |
| 7,724,008 B2 * | 5/2010 | Johnson | 324/762.05 |
| 7,733,106 B2 | 6/2010 | Dozier, II et al. | |
| 7,786,745 B2 | 8/2010 | Johnson | |
| 7,791,174 B2 * | 9/2010 | Johnson | 257/621 |
| 8,030,957 B2 * | 10/2011 | Lindsey et al. | 324/755.01 |
| 8,232,818 B2 * | 7/2012 | Desta et al. | 324/756.01 |
| 2007/0279074 A1 * | 12/2007 | Kasukabe et al. | 324/754 |
| 2008/0018341 A1 * | 1/2008 | Johnson | 324/555 |
| 2008/0143365 A1 | 6/2008 | Kiesewetter et al. | |
| 2008/0218192 A1 * | 9/2008 | Johnson | 324/765 |
| 2009/0212798 A1 | 8/2009 | Kasukabe et al. | |
| 2012/0074976 A1 | 3/2012 | Durbin et al. | |

* cited by examiner

*Primary Examiner* — Joshua Benitez Rosario
(74) *Attorney, Agent, or Firm* — Perkins Coie LLP

(57) ABSTRACT

A wafer translator and a wafer, removably attached to each other, provides the electrical connection to electrical contacts on integrated circuits on a wafer in such a manner that the electrical contacts are substantially undamaged in the process of making such electrical connections. Various embodiments of the present invention provide a gasketless sealing means for facilitating the formation by vacuum attachment of the wafer/wafer translator pair. In this way, no gasket is required to be disposed between the wafer and the wafer translator. Air, or gas, is evacuated from between the wafer and wafer translator through one or more evacuation pathways in the gasketless sealing means.

10 Claims, 21 Drawing Sheets

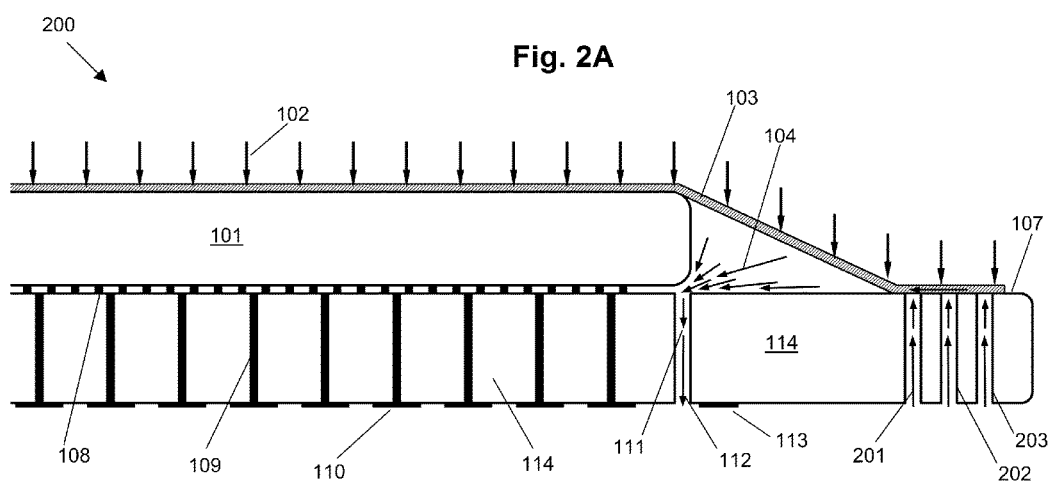

700

MAINTAINING A WAFER/WAFER TRANSLATOR PAIR IN AN ATTACHED STATE FREE OF A GASKET DISPOSED THEREBETWEEN

FIELD OF THE INVENTION

The present invention relates generally to semiconductor test equipment, and more particularly relates to methods and apparatus for maintaining an assembly including a wafer and a wafer translator in a removably attached state.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, planarizing, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. During the electrical testing that takes place as part of the process of manufacturing and preparing integrated circuits for use by customers, these conductive regions are commonly contacted with a probe card.

It has been common to mount the wafer on a moveable chuck, which is used to position the wafer relative to a probe card, and to hold the wafer in place during testing. In alternative arrangements for testing the unsingulated integrated circuits of a wafer, a wafer translator is disposed between the wafer and any other testing or connection apparatus.

What is needed are methods and apparatus for maintaining the wafer and wafer translator in a removably attached state.

SUMMARY OF THE INVENTION

Briefly, a gasketless arrangement for removably attaching a wafer and a wafer translator to each other by means of a vacuum, or pressure differential, includes a flexible material, disposed so as to enclose the space between the wafer and the wafer translator to the extent that that space may be evacuated through one or more evacuation paths.

In a further aspect of the present invention, at least one evacuation pathway is provided through the gasketless sealing means.

In an alternative arrangement, at least one evacuation pathway is provided through the wafer translator.

BRIEF DESCRIPTION OF THE DRAWINGS

FIG. 2A is a cross-sectional view of a wafer/wafer translator pair with a gasketless sealing means in accordance with the present invention, at the beginning of an evacuation process, where the wafer translator includes air passages in its outer circumferential region.

DETAILED DESCRIPTION

Figure 1A:
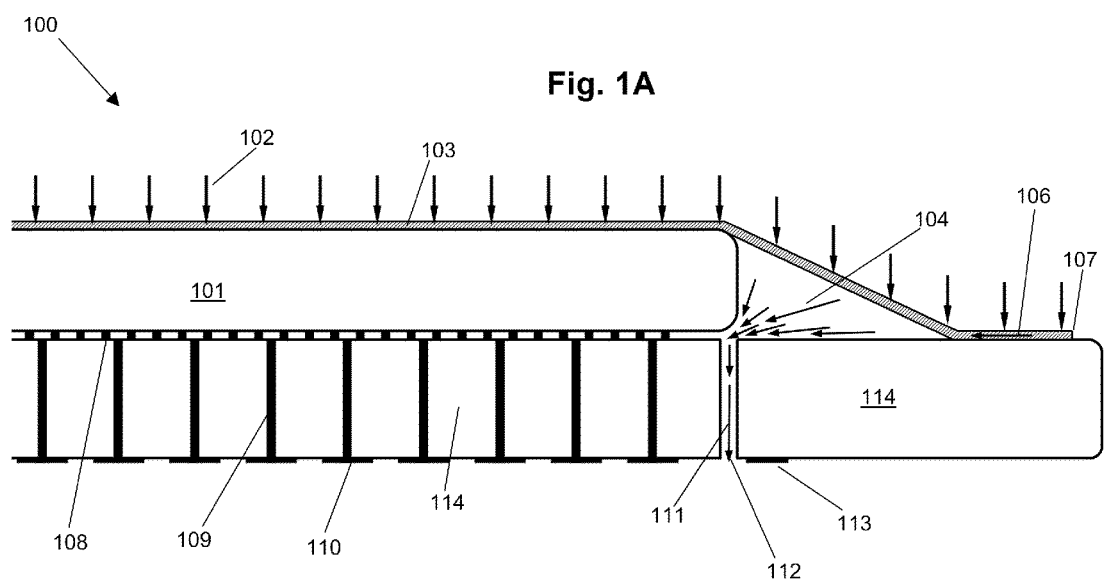
FIG. 1A is a cross-sectional view of a wafer/wafer translator pair with a gasketless sealing means in accordance with the present invention, at the beginning of an evacuation process.

Generally, the use of a wafer/wafer translator pair in the attached state provides the electrical connection to the pads of the unsingulated integrated circuits in such a manner that the pads are substantially undamaged in the process of making these electrical connections. Various embodiments of the present invention provide a gasketless sealing means for facilitating the vacuum attachment of the wafer/wafer translator pair. In this way, no gasket is required to be disposed between the wafer and the wafer translator. All or some portion of the air, or any gas or combination of gases, is evacuated from between the wafer and wafer translator through one or more evacuation pathways in the gasketless sealing means.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

The term "tester" as used herein refers to equipment, typically electrical equipment, that is used to determine whether an integrated circuit is performing in accordance with a predetermined specification.

Pad refers to a metallized region of the surface of an integrated circuit, which is used to form a physical connection terminal for communicating signals and power to and/or from the integrated circuit.

The expression "wafer translator" refers to an apparatus facilitating the connection of pads (sometimes referred to as terminals, I/O pads, contact pads, bond pads, bonding pads, chip pads, test pads, or similar formulations) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator is typically disposed between a wafer and other electrical components, and/or electrical connection pathways. The wafer translator is typically removably attached to the wafer (alternatively the wafer is removably attached to the translator). The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals, or contact structures, that matches the layout of at least a portion of the pads of the integrated circuits on the wafer. The wafer translator, when disposed between a wafer and other electrical components such as an inquiry system interface, makes electrical contact with one or more pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning. In some embodiments a flexible wafer translator offers compliance to the surface of a wafer mounted on a rigid support, while in other embodiments, a wafer offers compliance to a rigid wafer translator. The surface of the translator that is configured to face the wafer in operation is referred to as the wafer-side of the translator. The surface of the translator that is configured to face away from the wafer is referred to as the inquiry-side of the translator. An alternative expression for inquiry-side is tester-side.

The expression "edge-extended wafer translator" refers to an embodiment of a wafer translator in which electrical pathways disposed in and/or on the wafer translator lead from contact structures on the wafer-side of the wafer translator, which in use contact the wafer under test, to electrical terminals disposed outside of a circumferential edge of a wafer aligned for connection with, or attached to, the edge-extended wafer translator.

The expression "gasketless sealing means", as used herein, refers to various means in accordance with the present invention that, when assembled, act to provide a substantially airtight seal for the space between the wafer and the wafer translator without disposing a gasket between the topside of the wafer and the wafer translator.

The expression "translated wafer" refers to a wafer/wafer translator pair that are in the attached state, wherein a predetermined portion of, or all of, the contact pads of the integrated circuits on the wafer are in electrical contact with corresponding electrical connection means disposed on the wafer-side of the translator. Removable attachment may be achieved, for example, by means of vacuum, or pressure differential, attachment. That is, by reducing the pressure in the space between the wafer and the wafer translator relative to the pressure, typically atmospheric pressure, outside that space, the wafer and wafer translator remain in the attached state.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

Figure 1B:
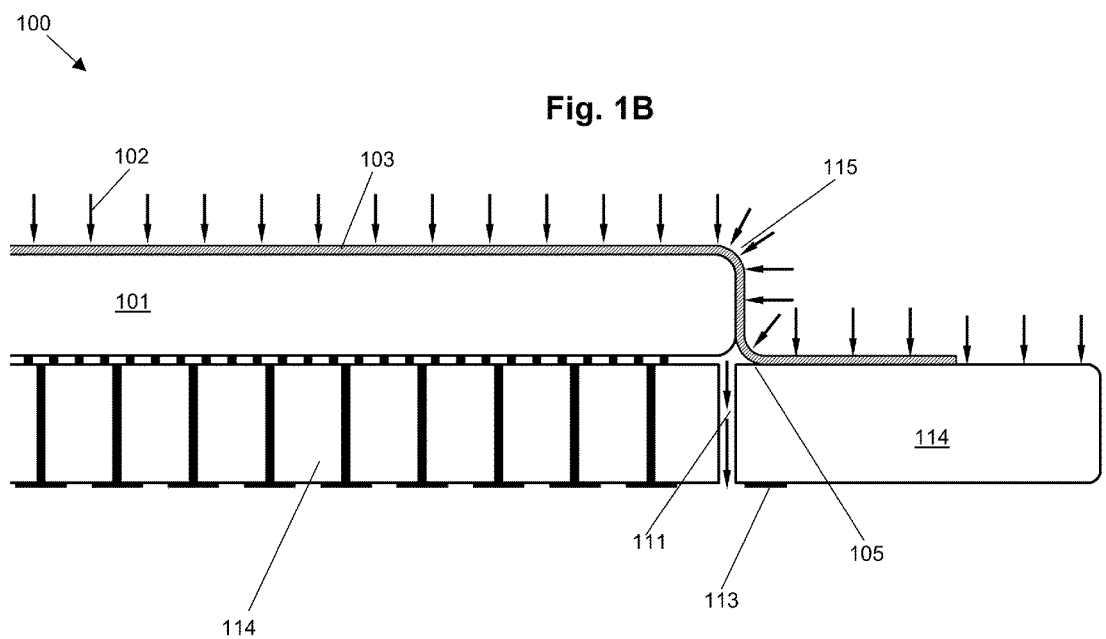
FIG. 1B is a cross-sectional view of a wafer/wafer translator pair with a gasketless sealing means in accordance with the present invention, after the evacuation process has brought the gasketless sealing means into compliance with the wafer/wafer translator pair.
Figure 1C:
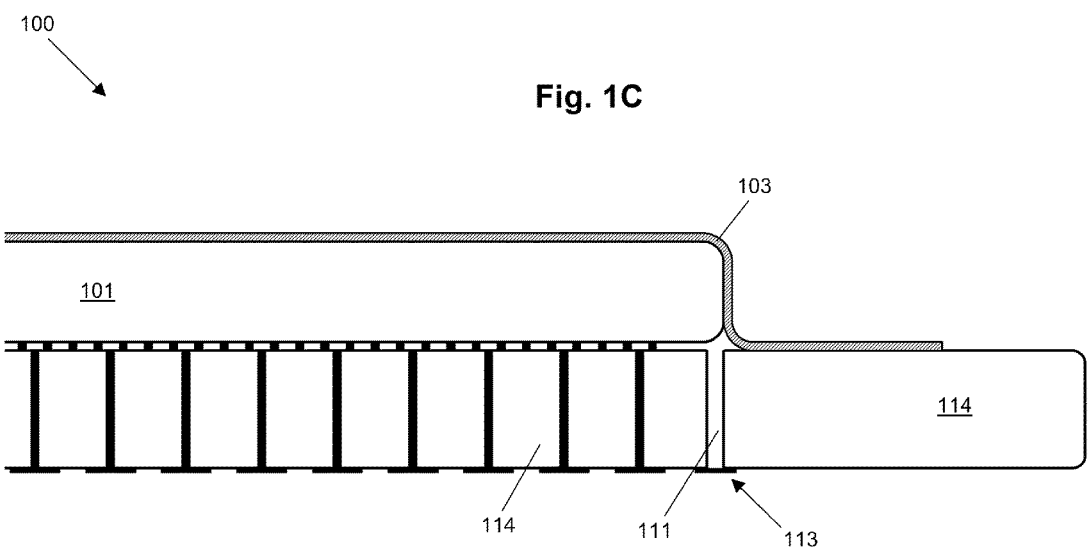
FIG. 1C is similar to FIG. 1B, except that the evacuation pathway sealing means has been moved into the closed position.

FIGS. 1A-1C illustrate a wafer disposed on the wafer-side of an edge-extended wafer translator, a gasketless sealing means disposed over the backside of the wafer and a portion of the wafer-side of the edge-extended wafer translator, an evacuation pathway disposed in the edge-extended wafer translator, and an evacuation path seal disposed on the inquiry-side of the edge-extended wafer translator. In FIGS. 1A-1C, the gasketless sealing means moves from an initial position prior to the evacuation of the space between the wafer and the wafer translator to a final position when the space has been substantially evacuated.

Referring to FIG. 1A, a cross-sectional view shows a wafer/wafer translator pair 100 with a gasketless sealing means 103 in accordance with the present invention, at the beginning of an evacuation process. Wafer/wafer translator pair 100 includes a wafer 101 disposed on the wafer-side of edge-extended wafer translator 114. Wafer 101 has a topside, a backside, and a peripheral sidewall. In the illustrative embodiment of FIG. 1A, the topside of wafer 101 is disposed on the wafer-side of edge-extended wafer translator 114. Wafer translator 114 has a plurality of contact structures 108 disposed on its wafer-side, and a plurality of contact pads 110 on its inquiry-side. Contact structures 108 are arranged in a pattern to match the placement of pads on the integrated circuits of wafer 101. Contact structures 108 are electrically coupled to corresponding contact pads 110 through conductive pathways 109. Although conductive pathways 109 are shown as straight lines in the illustrative embodiment of FIGS. 1A-1C, it is noted that a conductive pathway between a contact structure 108 and a contact pad 110 may include a portion that is arranged to run laterally through at least a portion of edge-extended wafer translator 114. Wafer translator 114 further includes an evacuation pathway 111 and an evacuation pathway seal 113. In this illustrative embodiment, evacuation pathway 111 is disposed in a region of edge-extended wafer translator 114 where wafer 101 overlaps edge-extended wafer translator 114. Alternative embodiment may locate one or more evacuation pathways differently with respect to the location of wafer 101 as long as such locations are effective in evacuating the space between the wafer and the edge-extended wafer translator.

Still referring to FIG. 1A, it can be seen that a first portion of gasketless sealing means 103 is disposed over the backside of wafer 101, a second portion of gasketless sealing means 103 angles towards wafer translator 114, and a third portion of gasketless sealing means 103 is disposed on a peripheral region of the wafer-side of wafer translator 114. In this illustrative embodiment, gasketless sealing means 103 is characterized by being a sheet of flexible material. Typically, gasketless sealing means 103 has a shape that is congruent with wafer 101. Reference numeral 105 indicates a point where gasketless sealing means 103 first reaches wafer translator 114, and reference numeral 107 indicates the outer edge of gasketless sealing means 103. Reference numeral 102 indicates the pressure exerted by the atmosphere. The air, or gas(es), in the space between wafer 101, gasketless sealing means 103 and edge-extended wafer translator 114, may be partially or completely evacuated through one or more evacuation pathways such as evacuation pathway 111. In operation, evacuation pathway seal 113 is moved from its sealing position of evacuation pathway 111, and a vacuum source (not shown) is coupled to evacuation pathway 111. The air, or gas(es), is removed along the pathway indicated by reference numerals 104 and 112. In this illustrative embodiment, as the evacuation process continues, the outer edge 107 begins to move toward wafer 101 as indicated by arrow 106.

Still referring to FIG. 1A, gasketless sealing means 103 may be placed in its initial, i.e., pre-evacuation, position by, for example, a pick-and-place type vacuum tool (not shown) that holds gasketless sealing means 103, and moves it into position over wafer 101 and edge-extended wafer translator 114. In some embodiments, the tool releases its hold on gasketless sealing means 103 prior to the evacuation of the space between the wafer and the edge-extended wafer translator, whereas in other embodiments, the evacuation of the space between the wafer and the edge-extended wafer translator begins prior to release by the tool.

Referring to FIG. 1B, a cross-section of wafer/wafer translator pair 100 with a gasketless sealing means 103 is shown after the evacuation process has brought gasketless sealing means 103 into compliance with the wafer/wafer translator pair 100. It can be seen at 115, that gasketless sealing means 103 is disposed adjacent the sidewall of wafer 101, and adjacent the wafer-side of edge-extended wafer translator 114.

FIG. 1C is similar to FIG. 1B, except that the evacuation pathway seal 113 has been moved into the closed position. Evacuation pathway seal is put in place after the internal space between wafer 101, gasketless sealing means 103, and wafer translator 114 has been partially or completely evacuated. In this state, atmospheric pressure holds wafer 101 and wafer translator 114 together.

Figure 2B:
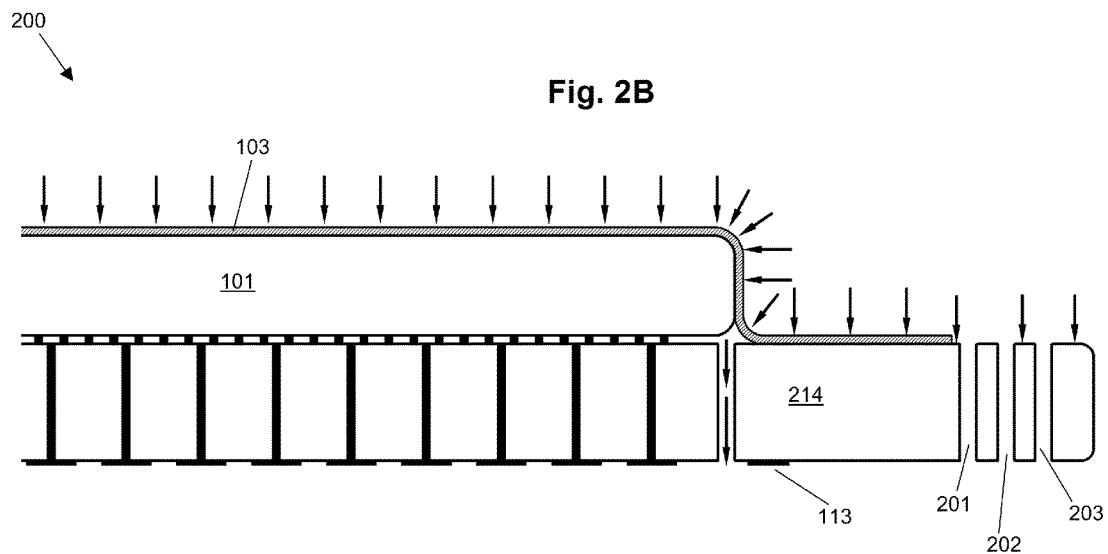
FIG. 2B is a cross-sectional view of a wafer/wafer translator pair with a gasketless sealing means in accordance with the present invention, after the evacuation process has brought the gasketless sealing means into compliance with the wafer/wafer translator pair, and the gasketless sealing means has slid past the air passages.
Figure 2C:
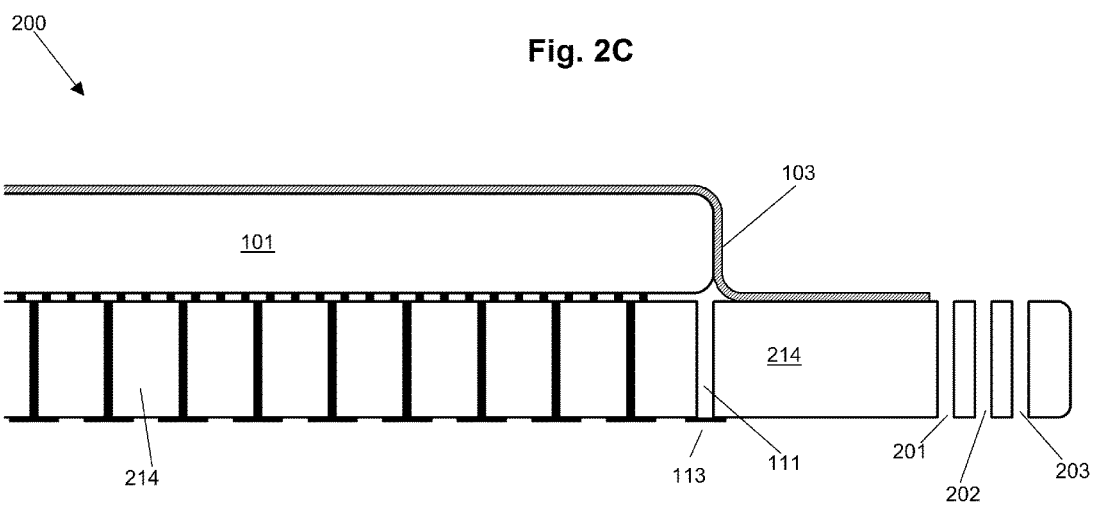
FIG. 2C is similar to FIG. 2B, except that the evacuation pathway sealing means has been moved into the closed position.

FIGS. 2A-2C illustrate an alternative embodiment of a gasketless sealing means arrangement for a wafer/wafer translator pair similar to the embodiment of FIGS. 1A-1C, but wherein the edge-extended wafer translator includes air passages in its outer circumferential (i.e., edge-extended) region. More particularly, FIG. 2A shows a cross-section of a wafer/wafer translator pair 200 with a gasketless sealing means 103, at the beginning of an evacuation process, where edge-extended wafer translator 214 includes air passages 201, 202, and 203 in its outer circumferential region. It is noted that the present invention is not limited to the number, diameter, or exact placement of air passages 201, 202, and 203. Air passages 201, 202, and 203 reduce the friction between gasketless sealing means 103 and the wafer-side of edge-extended wafer translator 214. FIG. 2B is a cross-sectional view of a wafer/wafer translator pair 200 with a gasketless sealing means 103, after the evacuation process has brought gasketless sealing means 103 into compliance with wafer/wafer translator pair 200, and gasketless sealing means 103 has slid past air passages 201, 202, 203. FIG. 2C is similar to FIG. 2B, except that evacuation pathway seal 113 has been moved into the closed position.

Figure 3:
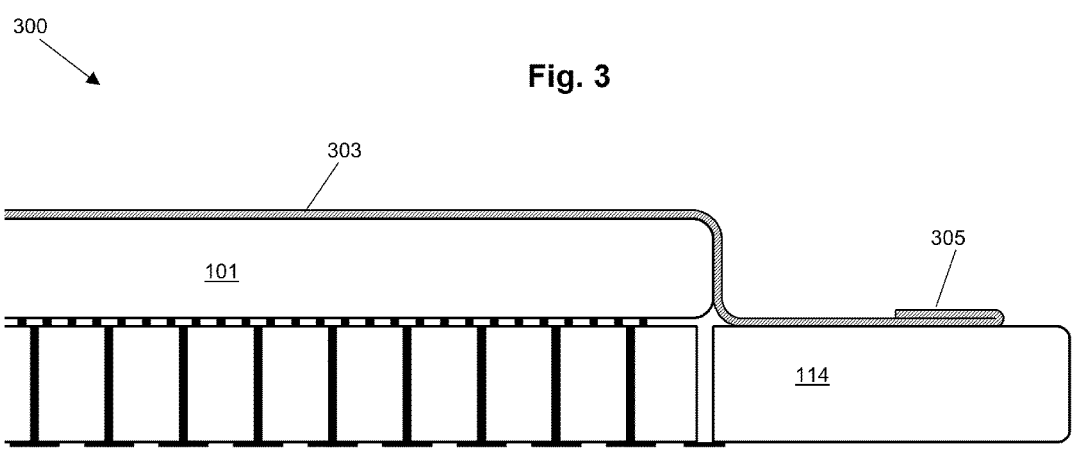
FIG. 3 is a cross-sectional view of a wafer/wafer translator pair with a gasketless sealing means drawn into compliance, and where the periphery of the gasketless sealing means is folded over itself to provide additional stiffness.

FIG. 3 illustrates an embodiment having a wafer/wafer translator pair 300 with a gasketless sealing means 303 drawn into compliance, and wherein the periphery of gasketless sealing means 303 is folded inwardly over itself 305 to provide additional stiffness.

Figure 4:
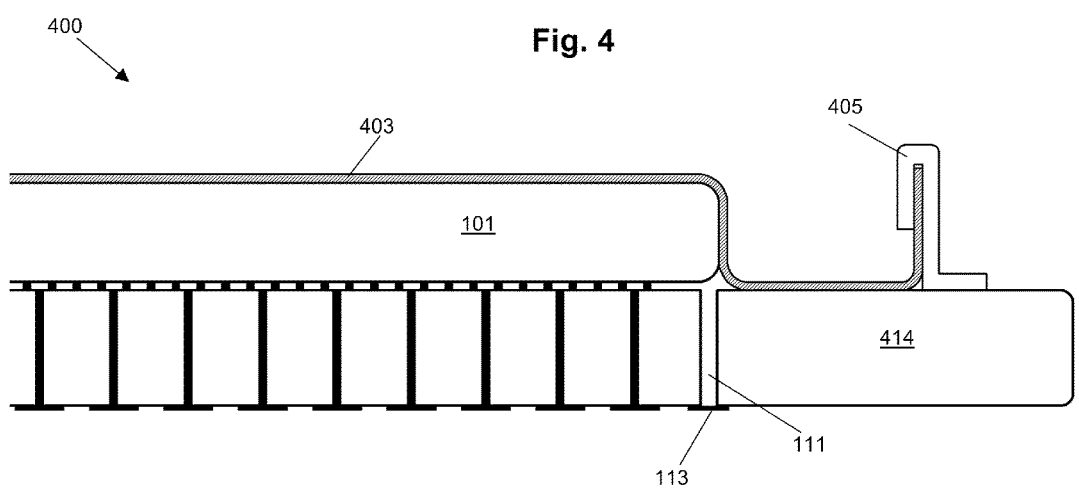
FIG. 4 is a cross-sectional view of a wafer/wafer translator pair with a gasketless sealing means drawn into compliance, further showing a structure for securing the outer periphery of the gasketless sealing means.

FIG. 4 illustrates an embodiment having a wafer/wafer translator pair 400 with a gasketless sealing means 403 drawn into compliance, and further showing a retaining structure 405 for securing the outer periphery of gasketless sealing means 403. Securing of gasketless sealing means 403 by retaining structure 405 may be accomplished by any suitable means including, but not limited to, crimping, gluing, and riveting. Retaining structure 405 is attached to edge-extended wafer translator 414 by any suitable means, including but not limited to one or more adhesives. In some embodiments, gasketless sealing means 403 is attached to retaining structure 405 to form a subassembly, and that subassembly is positioned such that a first portion of gasketless sealing means 403 is in contact with the backside of wafer 101, a second portion is in contact with the wafer-side of edge-extended wafer translator 414 and retaining structure 405 is disposed on the wafer-side of edge-extended wafer translator 414.

Figure 5:
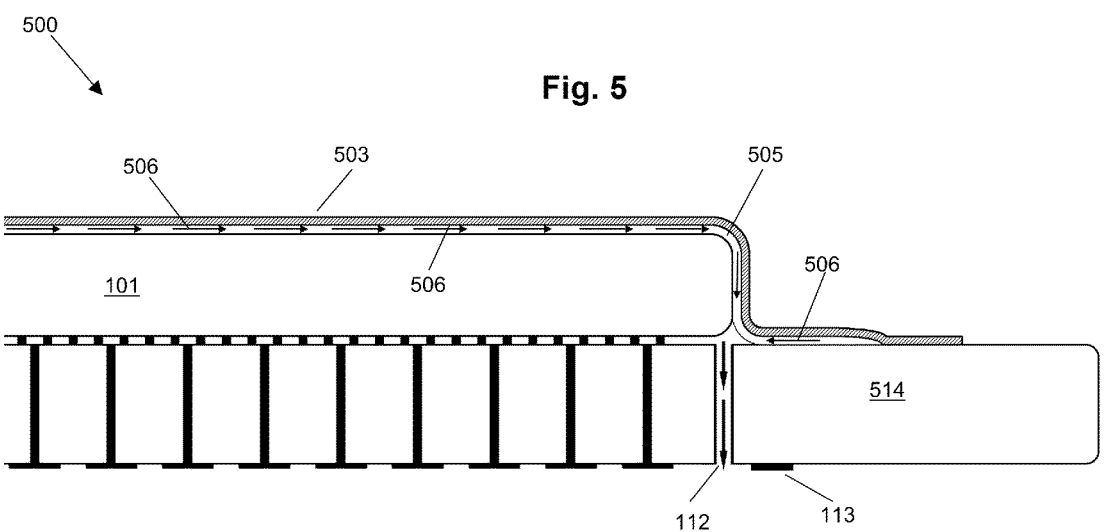
FIG. 5 is a cross-sectional view of a wafer/wafer translator pair with a gasketless sealing means in accordance with the present invention, and further showing a foam core material disposed between the wafer/wafer translator pair and the gasketless sealing means.

FIG. 5 illustrates an embodiment having a wafer/wafer translator pair 500 with a gasketless sealing means 503 drawn into compliance, and further showing a foam core material 505 disposed between gasketless sealing means 503, and wafer 101 and edge-extended wafer translator 514. In some embodiments, wafer 101 and edge-extended wafer translator 514 are aligned to each other and brought into contact, foam core material 505 is placed over wafer 101 and edge-extended wafer translator 514, and then gasketless sealing means 503 is placed over foam core material 505. Arrows 506 indicate the air being drawn out of foam core 505 and arrows 112 indicate the air being removed through the evacuation pathway in edge-extended wafer translator 514.

Figure 6:
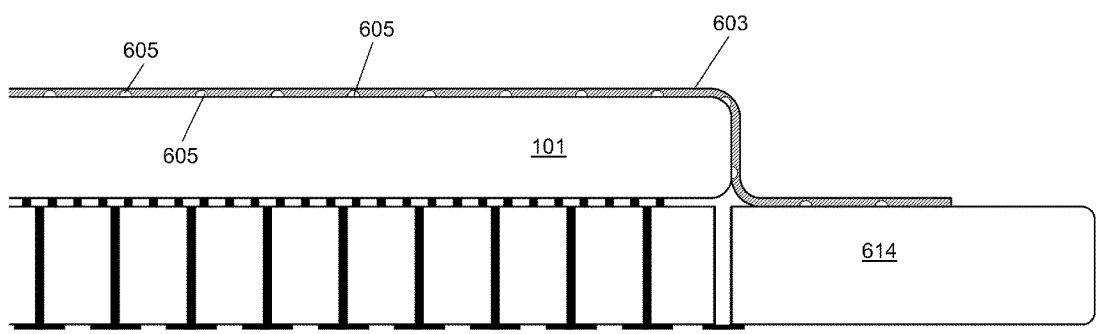
FIG. 6 is similar to FIG. 1C, except that the gasketless sealing means includes a plurality of air conduction channels formed on the inner surface thereof.

FIG. 6 shows an embodiment 600 similar to that illustrated in FIG. 1C, except that a gasketless sealing means 603 includes a plurality of air conduction channels 605 formed on the wafer-facing surface thereof. In the illustrative embodiment of FIG. 6, air conduction channels 605 each comprise a recess in a surface of gasketless sealing means 603 that faces wafer 101 and edge-extended wafer translator 614. It is noted that various embodiments of the present invention may include two or more recess shapes and/or depths. In typical embodiments, the air conduction channels are disposed in the wafer-facing surface in a pattern that includes a first set of parallel channels and a second set of parallel channels, wherein the first set and the second set are perpendicular to each other.

Figure 7:
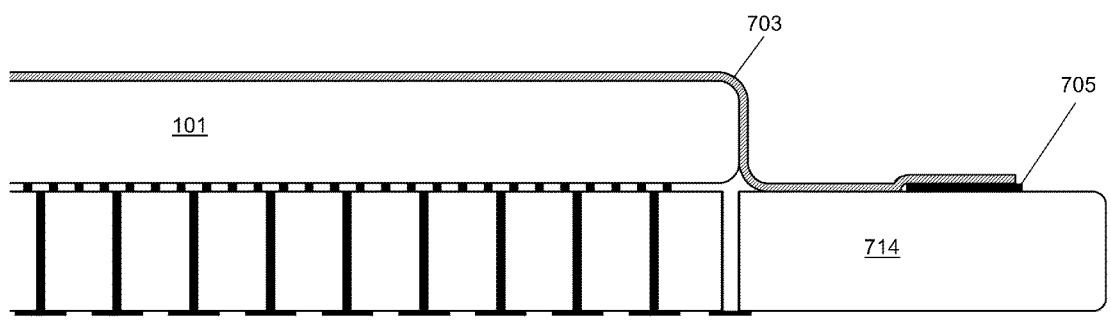
FIG. 7 is similar to FIG. 1C, except that the periphery of the gasketless sealing means overlaps with an adhesive region disposed on the wafer translator.

FIG. 7 shows an embodiment 700 similar to that illustrated in FIG. 1C, except that the periphery, i.e., the outer edge portion, of a gasketless sealing means 703 overlaps with, and is adhered to, an adhesive region 705 that is disposed on the wafer-side of a edge-extended wafer translator 714.

Figure 8:
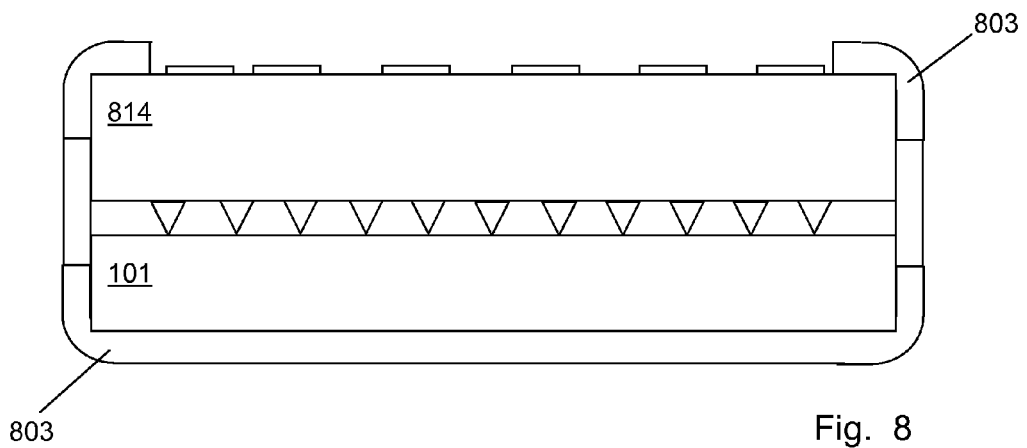
FIG. 8 is a cross-sectional view of a wafer/wafer translator pair with a gasketless sealing means that surrounds the backside of the wafer and portions of the inquiry-side of the wafer translator.

FIG. 8 is a cross-sectional view of a wafer/wafer translator pair with a gasketless sealing means 803 that surrounds the backside of wafer 101, the peripheral sidewall of wafer 101, the peripheral sidewall of wafer translator 814, and portions of the inquiry-side of wafer translator 814. In this illustrative embodiment the wafer translator is not an edge-extended wafer translator, i.e., the wafer and the wafer translator have substantially the same diameter.

Figure 9:
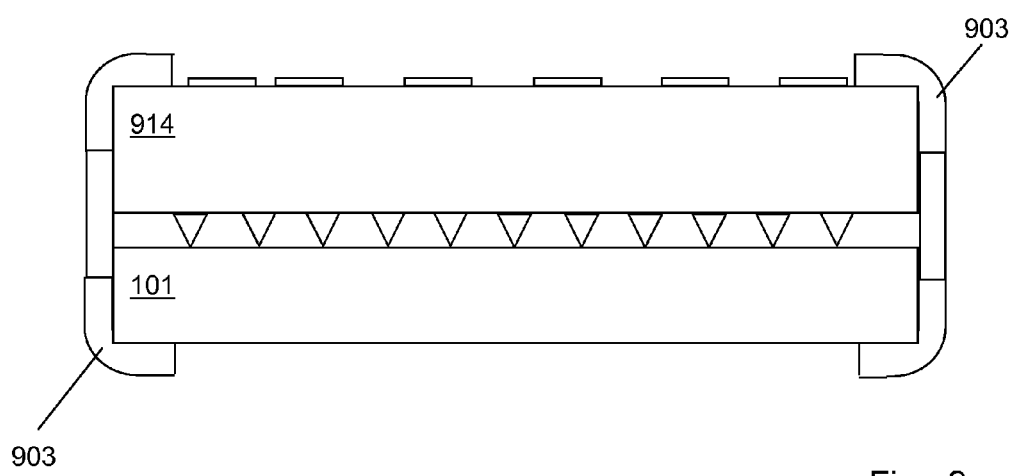
FIG. 9 is a cross-sectional view of a wafer/wafer translator pair with a gasketless sealing means that surrounds the peripheral edges of the wafer and the wafer translator, and further surrounds portions of the backside of the wafer and portions of the inquiry-side of the translator.

FIG. 9 shows a wafer/wafer translator pair with a gasketless sealing means 903 that surrounds the peripheral edges of a wafer 101 and a wafer translator 914, gasketless sealing means 903 further surrounding portions of the backside of wafer 101 and portions of the inquiry-side of translator 914. Gasketless sealing means 903 is typically formed from a flexible or compliant material. In this illustrative embodiment, gasketless sealing means 903 has a first portion disposed adjacent a first portion of the backside of the wafer, a second portion disposed adjacent the peripheral sidewall of the wafer, and a third portion disposed adjacent the peripheral sidewall of the wafer translator, and a fourth portion disposed adjacent a portion of the inquiry-side of the wafer translator. More particularly, in the embodiment of FIG. 9, the first portion of gasketless sealing means 903 is an annular region at the periphery of the backside of the wafer, and therefore a significant portion of the wafer backside is left uncovered. In this illustrative embodiment the wafer translator is not an edge-extended wafer translator, i.e., the wafer and the wafer translator have substantially the same diameter. Typically, in this illustrative embodiment, the wafer and wafer are placed in a chamber and the air, or gas, is evacuated, then gasketless sealing means 903 is applied.

Figure 10:
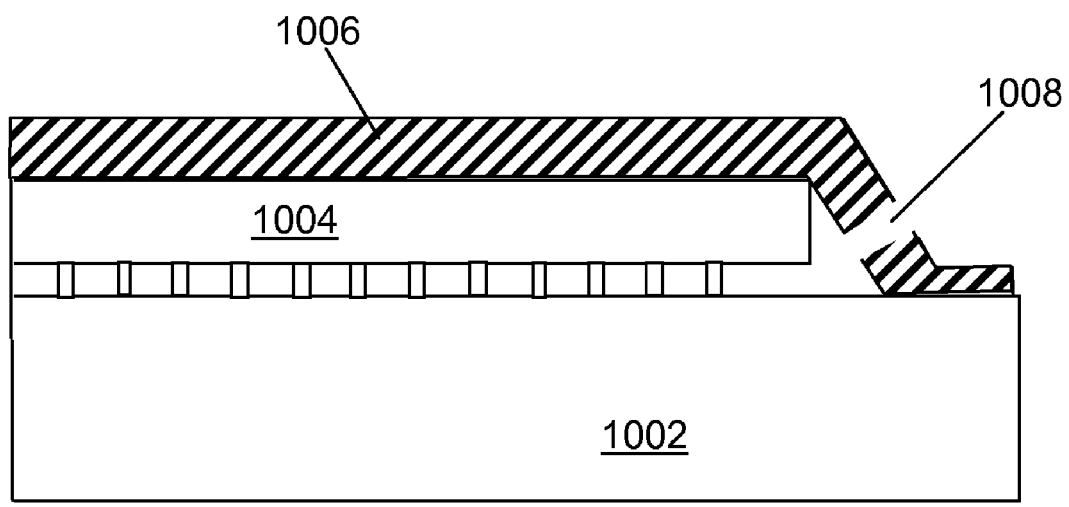
FIG. 10 is a cross-sectional view of a wafer/wafer translator pair with a gasketless sealing means having an evacuation pathway therein.

Referring to FIG. 10, an illustrative embodiment including a wafer translator 1002, a wafer 1004, and a gasketless sealing means 1006 are shown. An evacuation pathway 1008 is provided through gasketless sealing means 1006 so that air, or other gas(es), can be removed from between wafer translator 1002 and wafer 1004. It will be appreciated that evacuation pathway 1008 may be provided with any suitable plug or seal so that the assembly of FIG. 10 may be moved while the wafer and wafer translator are in the attached state. In some embodiments, evacuation pathway 1008 may be fitted with a vacuum connector suitable for connection and disconnection from a vacuum source. In this arrangement, it is not necessary to dispose an evacuation pathway in the edge-extended wafer translator.

It is noted that various embodiments of the present invention may provide one or more evacuation pathways disposed in both the wafer translator and the gasketless sealing means.

FIGS. 11-16 illustrate various aspects of an embodiment of the present invention that includes a support ring and a gasketless sealing means which includes two flexible support structures each seated in the support ring and each sitting adjacent opposite sides of an evacuation pathway through the support ring. This exemplary embodiment of an assembly in accordance with the present invention includes a chuck having an outer diameter; a ring having an outer diameter, and having an inner diameter greater than the outer diameter of the chuck, the ring disposed such that its inner diameter surface is adjacent the outer diameter surface of the chuck; one or more evacuation pathways disposed in the ring from a top side to a bottom side thereof; a first substantially circular groove disposed on the top side of the ring, inwardly of the one or more evacuation pathways; a second substantially circular groove disposed on the top side of the ring, outwardly of the one or more evacuation pathways; a first flexible support structure, the first flexible support structure having a base portion and an upper portion, the base portion seated in the first substantially circular groove and the upper portion extending upwardly with respect to the top side of the ring and angled toward the inner diameter surface of the ring; and a second flexible support structure, the second flexible support structure having a base portion and an upper portion, the base portion seated in the second substantially circular groove and the upper portion extending upwardly with respect to the top side of the ring and angled toward the outer diameter surface of the ring. The assembly may further include a wafer having a topside and a backside, an annular peripheral portion of the backside of the wafer disposed on the upper portion of the first flexible support structure. The assembly may also include a wafer translator having a wafer-side and an inquiry-side, an annular peripheral portion of the wafer-side of the wafer translator disposed on the upper portion of the second flexible support structure. The substantially circular grooves in the top side of the ring may be flanged grooves so as facilitate retention of the base portions of the flexible support structures. The one or more evacuation pathways in the ring may be fitted with valves to open and close the evacuation pathways. The chuck, which is disposed adjacent the ring, typically includes a plurality of lift pins, and in some embodiments, may further include vacuum holes so that it can act as a vacuum hold-down device for the wafer. Typically, the wafer translator and wafer are aligned with respect to each other such that contact structures disposed on the wafer-side of the wafer translator and pads on the topside of the wafer make electrical contact with each other when the space between the wafer and wafer translator is evacuated, and air pressure on the backside of the wafer and the inquiry-side of the wafer translator hold the two in a removably attached state. During the alignment process It will be appreciated that the first and second flexible support structures together with the ring act as a seal to maintain the vacuum, or partial vacuum, between the wafer and wafer translator.

Figure 11:
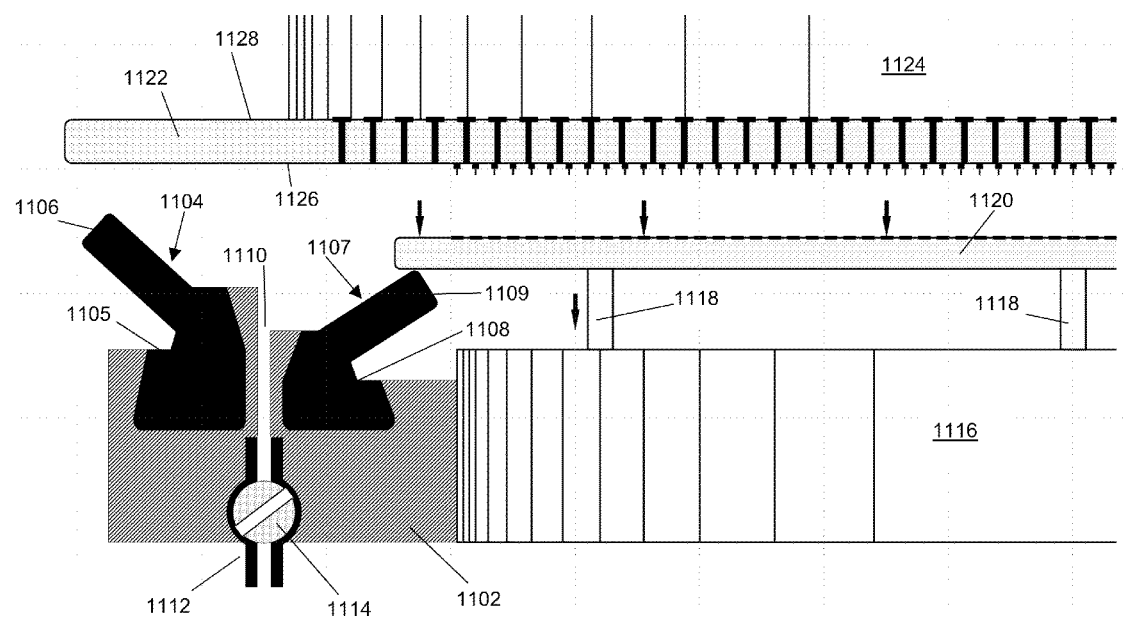
FIG. 11 is a cross-sectional view of a support ring and a gasketless sealing means adapted to evacuate the space between a wafer and an edge-extended wafer translator through an evacuation pathway in the support ring, with the wafer and the wafer translator in a first illustrative arrangement.

Referring to FIG. 11 a cross-sectional view of a support ring 1102 and a gasketless sealing means, which includes a first flexible support structure 1104, and a second flexible support structure 1107, the ring and sealing means adapted to evacuate the space between a wafer 1120 and an edge-extended wafer translator 1122 through an evacuation pathway 1110 in support ring 1102, with wafer 1120 and wafer translator 1122 in a first illustrative arrangement. Ring 1102 is typically fabricated from a metal, but the invention is not limited to any particular material composition for ring 1102. Some embodiments include a plurality of evacuation pathways disposed from the top side to the bottom side of ring 1102. In this first illustrative arrangement, support ring 1102 is disposed such that it is abutting chuck 1116. Chuck 1116 includes a plurality of lift pins 1118, which are in the upwardly extended position in FIG. 11. Wafer 1120 has been delivered into this arrangement by a wafer robot or similarly well-known wafer transport equipment. The backside of wafer 1120 is supported by upwardly extended lift pins 1118, and an annular peripheral region of the backside of wafer 1120 is disposed on an upper portion 1109 of first flexible support structure 1107. A base portion 1108 of first flexible support structure 1107 is seated within a first flanged groove on the topside of ring 1102. In this example, the first flanged groove runs continuously around the topside of ring 1102. The first flanged groove and first flexible support structure 1107 are disposed inwardly of evacuation pathway 1110. A second flexible support structure 1104 has a base portion 1105 and an upper portion 1106. Base portion 1105 of second flexible support structure 1104 is disposed in a second flanged groove. The second flanged groove and second flexible support structure 1104 are disposed outwardly of evacuation pathway 1110. An edge-extended wafer translator 1122 having a wafer-side 1126 and an inquiry-side 1128 is shown disposed in a spaced apart relation to wafer 1120, and further shown being held in place by a vacuum chuck 1124.

In this illustrative embodiment, wafer 1120 is a silicon wafer, and edge-extended wafer translator 1122 includes a silicon substrate. It is noted that the present invention is not limited to arrangements in which both the wafer and the wafer translator are comprised of silicon.

Still referring to FIG. 11, a vacuum coupling 1112, including a valve 1114, is coupled to evacuation pathway 1110. In the example shown, a portion of vacuum coupling 1112 is disposed within ring 1102. It will be appreciated that that any suitable alternative configuration for coupling evacuation pathway 1110 to a vacuum source may be adopted within the spirit and scope of the present invention.

In the embodiment illustrated in FIGS. 11-16, chuck 1116 has a diameter that is less than the diameter of wafer 1120; and wafer 1120 has a diameter that is less than the diameter of edge-extended wafer translator 1122. Support ring 1120 is sized such that evacuation pathway 1110 outside the circumference of wafer 1120. In this way, evacuation pathway 1110 is not blocked by wafer 1120.

Figure 12:
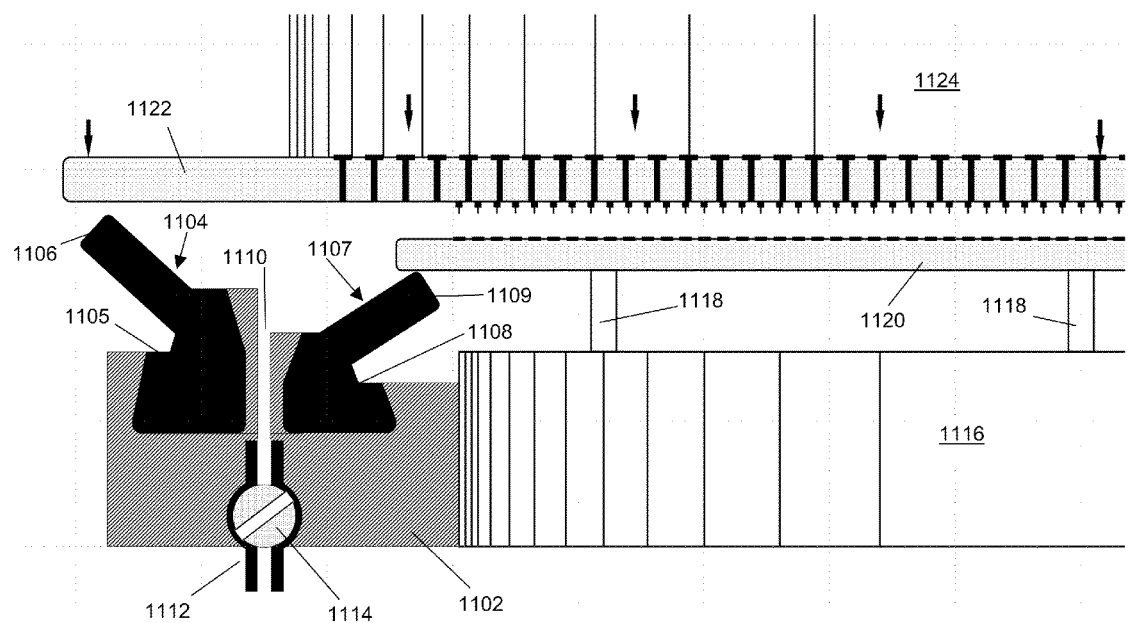
FIG. 12 is a cross-sectional view of a support ring and a gasketless sealing means adapted to evacuate the space between a wafer and an edge-extended wafer translator through an evacuation pathway in the support ring, with the wafer and the wafer translator in a second illustrative arrangement.

FIG. 12 is similar to FIG. 11, but shows wafer translator 1122 and vacuum chuck 1124 moved downward and positioned more closely to wafer 1120.

Figure 13:
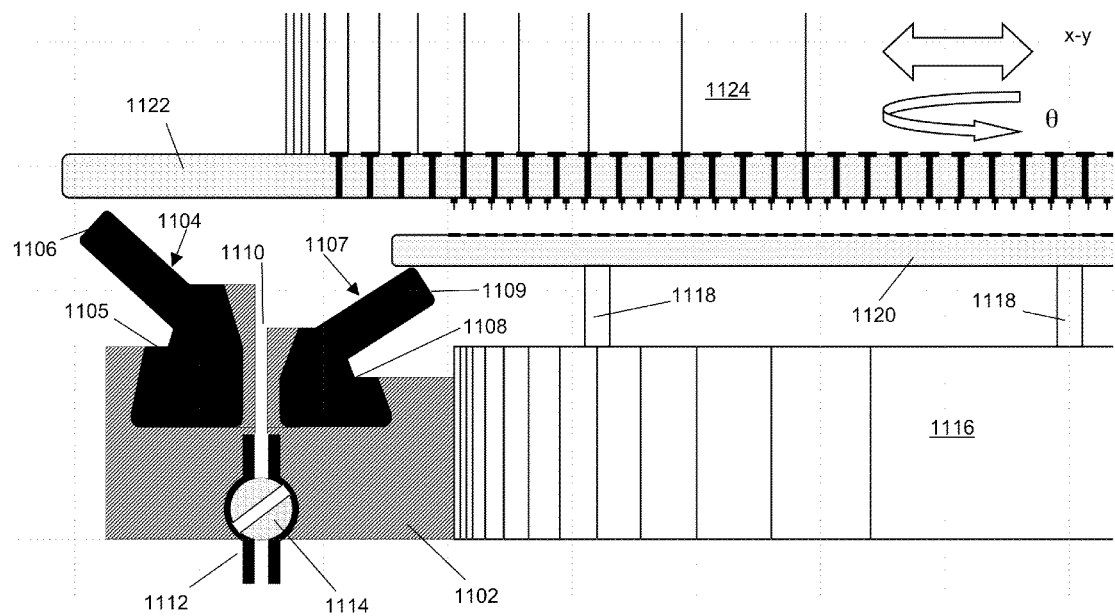
FIG. 13 is a cross-sectional view similar to FIG. 12, with indicating arrows to show translational (x-y) and rotational (θ) alignment of the wafer and the edge-extended wafer translator to each other.

FIG. 13 is similar to FIG. 12, but indicates the wafer-wafer translator alignment process taking place by showing an x-y alignment arrow for x-y translational alignment between the topside of wafer 1120 and the wafer-side of wafer translator 1122, and a θ alignment arrow for rotational alignment between the topside of wafer 1120 and the wafer-side of wafer translator 1122. Many well-known suitable methods and apparatus are available for such alignment to the wafer.

Figure 14:
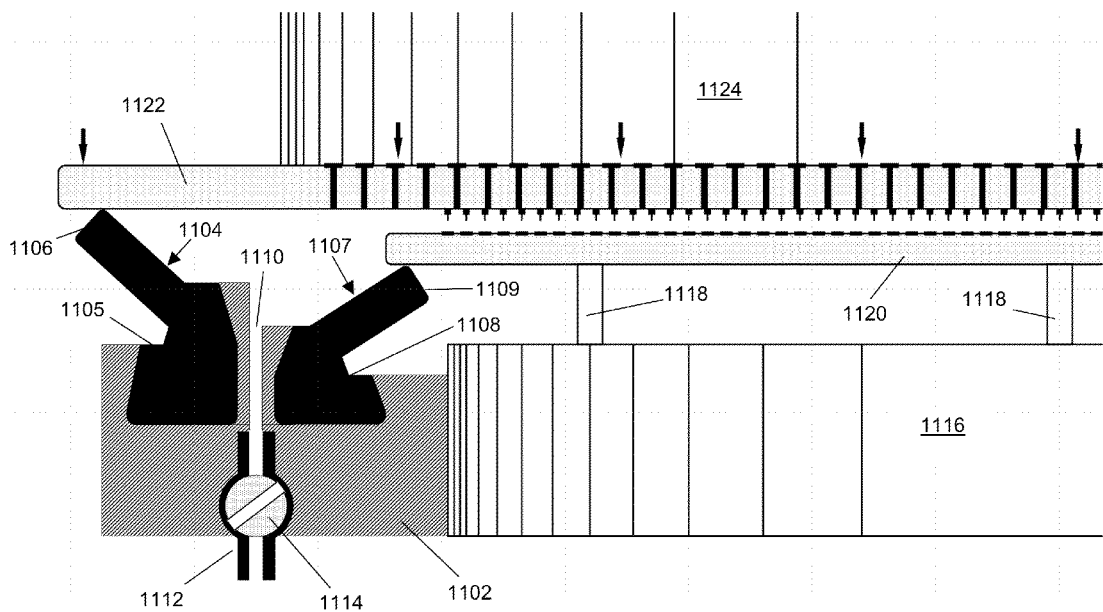
FIG. 14 is a cross-sectional view of a support ring and a gasketless sealing means adapted to evacuate the space between a wafer and an edge-extended wafer translator through an evacuation pathway in the support ring, with the wafer and the wafer translator in a third illustrative arrangement.

FIG. 14 is similar to FIG. 13, but shows wafer translator 1122, while still held by vacuum chuck 1124 and subsequent to the alignment operation of FIG. 13, moved downwardly such that a peripheral annular portion of the wafer-side of wafer translator 1122 is in contact with the upper portion 1106 of second flexible support structure 1104.

Figure 15:
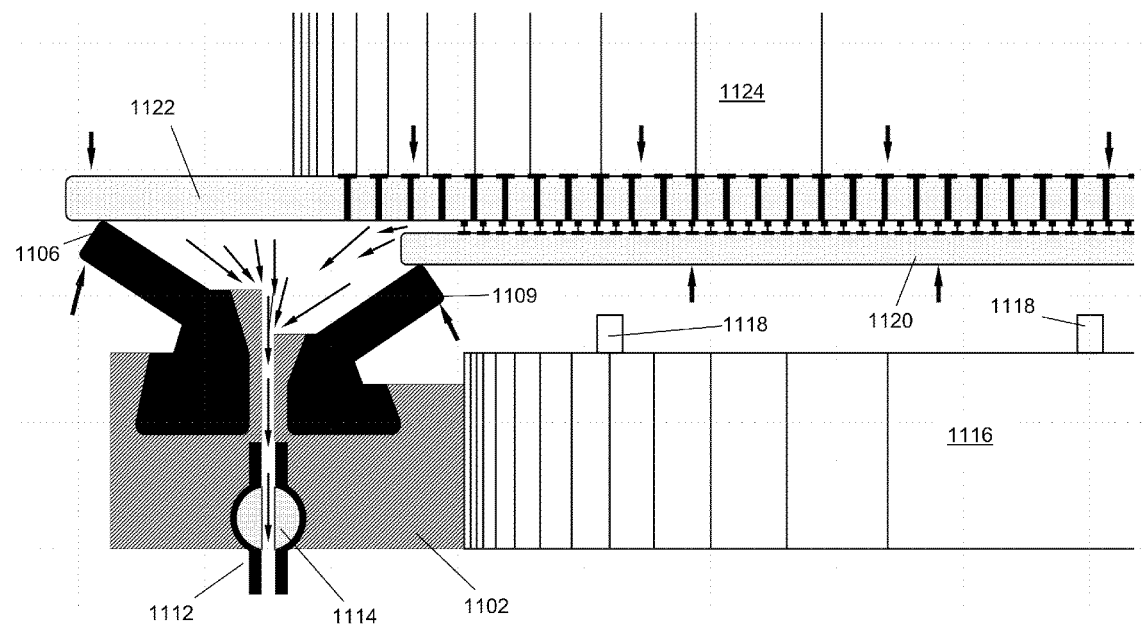
FIG. 15 is a cross-sectional view of a support ring and a gasketless sealing means adapted to evacuate the space between a wafer and a wafer translator through an evacuation pathway in the support ring, with the wafer and the wafer translator in a fourth arrangement.

FIG. 15 is similar to FIG. 14, but shows vacuum valve 1114 turned into the open position such that the air between wafer translator 1122 and wafer 1120 can be evacuated. Also shown in FIG. 15, are arrows indicating the flow of air out of the space between wafer translator 1122 and wafer 1120, through evacuation pathway 1110 and through open valve 1114 of vacuum coupling 1112. As the air is drawn out through the evacuation pathway, the air pressure of the atmosphere presses wafer translator 1122 and wafer 1120 into a removably attached state wherein the contact structures on the wafer-side of wafer translator 1122 make electrical connection to pads of wafer 1120. At this time, lift pins 1118 are lowered back into chuck 1116.

Figure 16:
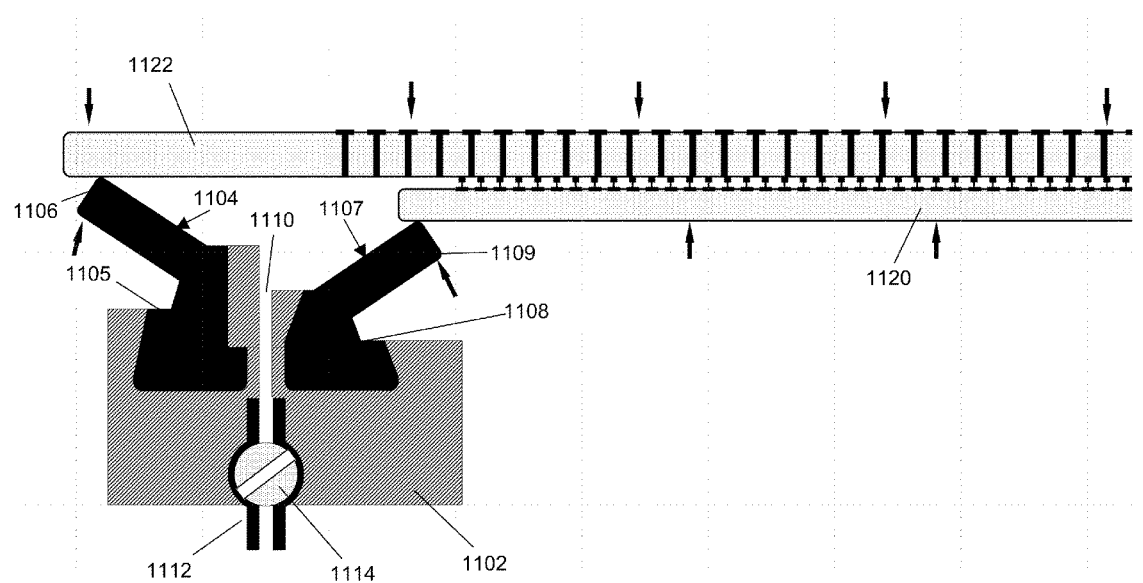
FIG. 16 is a cross-sectional view of a support ring and a gasketless sealing means adapted to evacuate the space between a wafer and an edge-extended wafer translator through an evacuation pathway in the support ring, with the wafer and the wafer translator in a fifth illustrative arrangement.

FIG. 16 shows the assembly of FIG. 15, after valve 1114 is closed, and chucks 1116 and 1124 are withdrawn. The arrows directed at the inquiry-side of wafer translator 1122 and the backside of wafer 1120 indicate the forces applied by the atmosphere. FIG. 16 shows an assembly with a wafer/wafer translator pair in the attached state without a gasket disposed between the topside of the wafer and the wafer-side of the wafer translator. The assembly of FIG. 16, in accordance with the present invention, is a portable unit, with wafer 1120, edge-extended wafer translator 1122, ring 1102, first flexible support structure 1107, second flexible support structure 1104, and valve 1114 enclosing, in a substantially air-tight manner, an evacuated interior space as shown.

Figure 17:
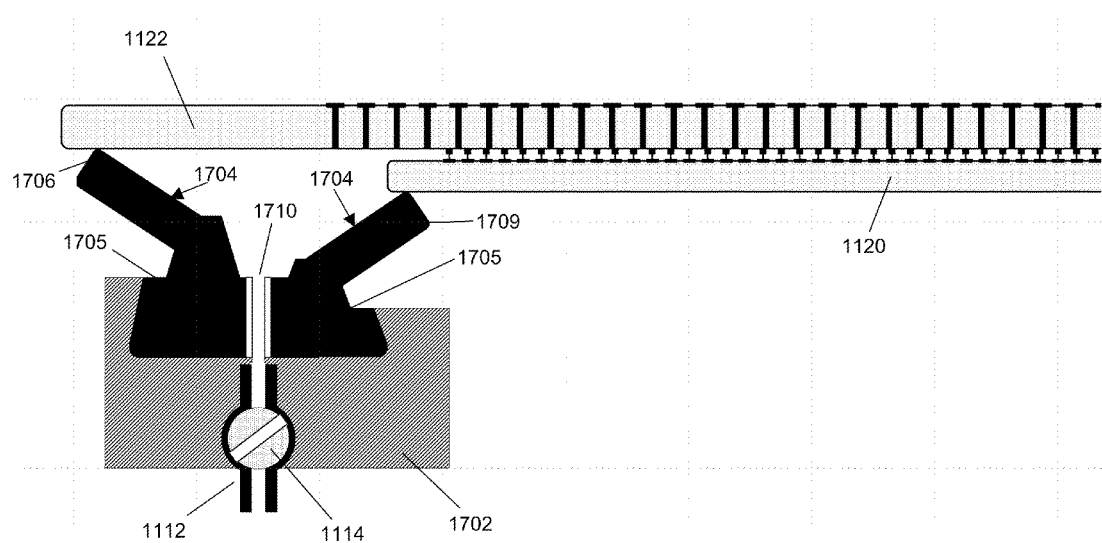
FIG. 17 is a cross-sectional view of an alternative support ring and a gasketless sealing means adapted to evacuate the space between a wafer and an edge-extended wafer translator through an evacuation pathway in both the gasketless sealing means and the support ring, with the wafer and the wafer translator in the attached state.

FIG. 17 is a cross-sectional view of an alternative support ring and gasketless sealing means adapted to evacuate the space between a wafer and an edge-extended wafer translator through an evacuation pathway in both the gasketless sealing means and the support ring, with the wafer and the edge-extended wafer translator in the attached state. The embodiment of FIG. 17 is similar to that of FIG. 16, but rather than having two flexible support structures each seated in a separate groove in the top side surface of the ring, this embodiment features a single groove and a single flexible support structure, the single flexible support structure having a single base portion and two upper portions as part of a unitary structure. One or more evacuation pathways pass through the base portion of the flexible support structure. More particularly, a ring 1702 and a gasketless sealing means, which includes a flexible support structure 1704, the ring and sealing means adapted to evacuate the space between wafer 1120 and edge-extended wafer translator 1122 through an evacuation pathway 1710 in flexible support structure 1704 and continuing through ring 1702. Ring 1702 is typically fabricated from a metal, but the invention is not limited to any particular material composition for ring 1702. Some embodiments include a plurality of evacuation pathways disposed in the flexible support structure and continuing through to the bottom side of ring 1702. The backside of wafer 1120 is disposed on a first upper portion 1709 of flexible support structure 1704. A base portion 1705 of flexible support structure 1704 is seated within a flanged groove on the topside of ring 1702. In this example, the flanged groove runs continuously around the topside of ring 1702. The flexible support structure 1704 is seated in the groove, and evacuation pathway 1710 is disposed through ring 1702 and through base portion 1705 of flexible support structure 1704. Edge-extended wafer translator 1122 is shown disposed such that a peripheral annular portion is disposed on upper portion 1706 of flexible support structure 1704.

Figure 18:
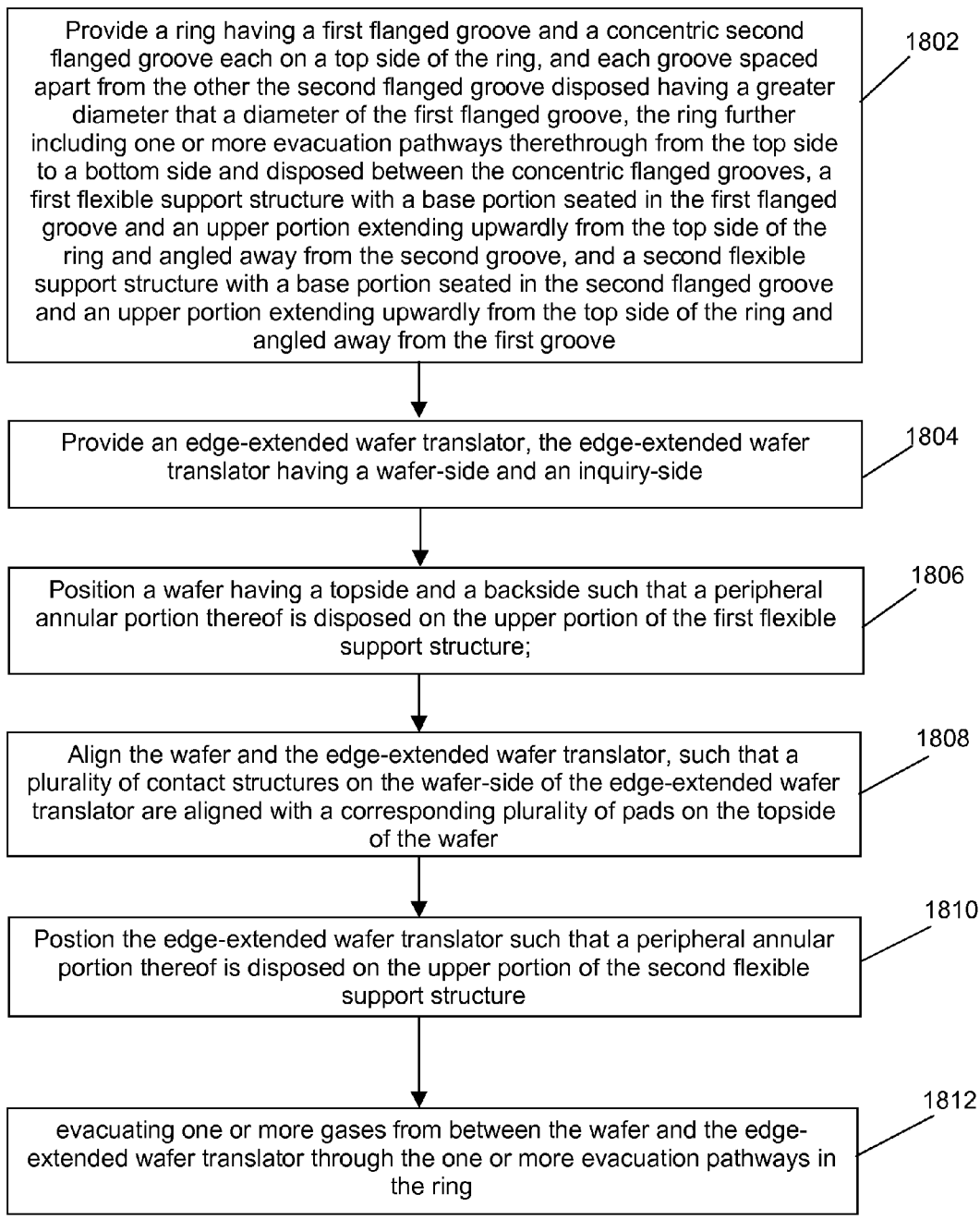
FIG. 18 is a flow diagram illustrating a method in accordance with the present invention.

Referring to FIG. 18, a flow diagram illustrates a method in accordance with the present invention that includes providing 1802 a ring having a first flanged groove and a concentric second flanged groove each on a top side of the ring, and each groove spaced apart from the other the second flanged groove disposed having a greater diameter that a diameter of the first flanged groove, the ring further including one or more evacuation pathways therethrough from the top side to a bottom side and disposed between the concentric flanged grooves, a first flexible support structure with a base portion seated in the first flanged groove and an upper portion extending upwardly from the top side of the ring and angled away from the second groove, and a second flexible support structure with a base portion seated in the second flanged groove and an upper portion extending upwardly from the top side of the ring and angled away from the first groove; providing 1804 an edge-extended wafer translator, the edge-extended wafer translator having a wafer-side and an inquiry-side; positioning 1806 a wafer having a topside and a backside such that a peripheral annular portion thereof is disposed on the upper portion of the first flexible support structure; aligning 1808 the wafer and the edge-extended wafer translator, such that a plurality of contact structures on the wafer-side of the edge-extended wafer translator are aligned with a corresponding plurality of pads on the topside of the wafer; positioning 1810 the edge-extended wafer translator such that a peripheral annular portion thereof is disposed on the upper portion of the second flexible support structure; and evacuating 1812 one or more gases from between the wafer and the edge-extended wafer translator through the one or more evacuation pathways in the ring.

In one illustrative embodiment, an assembly, includes a chuck having an outer diameter; a ring having an outer diameter, and having an inner diameter greater than the outer diameter of the chuck, the ring disposed such that its inner diameter surface is adjacent the outer diameter surface of the chuck; one or more evacuation pathways disposed in the ring from a topside to a bottom side thereof; a first substantially circular groove disposed on the topside of the ring, inwardly of the one or more evacuation pathways; a second substantially circular groove disposed on the topside of the ring, outwardly of the one or more evacuation pathways; a first flexible support structure, the first flexible support structure having a base portion and an upper portion, the base portion seated in the first substantially circular groove and the upper portion extending upwardly with respect to the topside of the ring and angled toward the inner diameter surface of the ring; and a second flexible support structure, the second flexible support structure having a base portion and an upper portion, the base portion seated in the second substantially circular groove and the upper portion extending upwardly with respect to the topside of the ring and angled toward the outer diameter surface of the ring. The illustrative assembly may further include a wafer having a topside and a backside, an annular peripheral portion of the backside of the wafer disposed on the upper portion of the first flexible support structure. The illustrative assembly may still further include a wafer translator having a wafer-side and an inquiry-side, an annular peripheral portion of the wafer-side of the wafer translator disposed on the upper portion of the second flexible support structure. In some embodiments, the first flexible support structure and the second flexible support structure are each rubber. Typically, the wafer and wafer translator are brought into contact by evacuating the space between the topside of the wafer, and the wafer-side of the wafer translator.

In one illustrative embodiment, a method, includes providing a ring having a first flanged groove and a concentric second flanged groove each on a top side of the ring, and each groove spaced apart from the other the second flanged groove disposed having a greater diameter that a diameter of the first flanged groove, the ring further including one or more evacuation pathways therethrough from the top side to a bottom side and disposed between the concentric flanged grooves, a first flexible support structure with a base portion seated in the first flanged groove and an upper portion extending upwardly from the top side of the ring and angled away from the second groove, and a second flexible support structure with a base portion seated in the second flanged groove and an upper portion extending upwardly from the top side of the ring and angled away from the first groove; providing an edge-extended wafer translator, the edge-extended wafer translator having a wafer-side and an inquiry-side; positioning a wafer having a topside and a backside such that a peripheral annular portion thereof is disposed on the upper portion of the first flexible support structure; aligning the wafer and the edge-extended wafer translator, such that a plurality of contact structures on the wafer-side of the edge-extended wafer translator are aligned with a corresponding plurality of pads on the topside of the wafer; positioning the edge-extended wafer translator such that a peripheral annular portion thereof is disposed on the upper portion of the second flexible support structure; and evacuating one or more gases from between the wafer and the edge-extended wafer translator through the one or more evacuation pathways in the ring.

Conclusion

The exemplary methods and apparatus illustrated and described herein find application in at least the field of integrated circuit test and analysis.

It is to be understood that the present invention is not limited to the illustrative embodiments described above, but encompasses any and all embodiments within the scope of the subjoined Claims and their equivalents.

What is claimed is:

1. An assembly, comprising:
   an edge-extended wafer translator having an inquiry-side, a wafer-side, and at least one evacuation pathway therethrough;
   a wafer having a topside with active sides of integrated circuits, a backside without active sides of integrated circuits, and a peripheral sidewall, the topside of the wafer disposed against the wafer-side of the edge-extended wafer translator;
   a sheet of flexible material having a first portion disposed along the backside of the wafer, a second portion disposed along the peripheral sidewall, and a third portion disposed along the wafer-side of the edge-extended wafer translator; and
   wherein an enclosed space defined at least in part by the wafer, the edge-extended wafer translator, and the sheet of flexible material is evacuated such that the pressure within the enclosed space is less than the pressure outside the enclosed space.

2. The assembly of claim 1, wherein the sheet of flexible material has a shape that is congruent with the wafer.

3. The assembly of claim 1, wherein the at least one evacuation pathway is disposed in a region of the edge-extended wafer translator inside an overlap between the wafer and the edge-extended wafer translator.

4. The assembly of claim 1, wherein the edge-extended wafer translator has at least one air passage disposed therethrough in an area outside of an overlap between the wafer and the edge-extended wafer translator.

5. The assembly of claim 1, wherein an outer portion of the sheet of flexible material is folded over an adjacent inner portion of the sheet of flexible material.

6. The assembly of claim 1, further comprising:
   a retaining structure attached to the wafer-side of the edge-extended wafer translator;
   wherein an outer edge portion of the gasketless sealing means is attached to the retaining structure.

7. The assembly of claim 1, wherein the gasketless sealing means has a plurality of air conduction channels formed on the inner surface thereof.

8. The assembly of claim 7, wherein at least one of the air conduction channels comprises a recess in the gasketless sealing means.

9. The assembly of claim 1, further comprising:
   an adhesive disposed on a portion of the wafer-side of the edge-extended wafer translator;
   wherein an outer edge portion of the gasketless sealing means is disposed on and adhered to the adhesive.

10. The assembly of claim 1, further comprising an air-permeable foam core material between the sheet of flexible material and the backside of the wafer.

* * * * *

UNITED STATES PATENT AND TRADEMARK OFFICE
CERTIFICATE OF CORRECTION

| | | |
|---|---|---|
| PATENT NO. | : 8,362,797 B2 | Page 1 of 1 |
| APPLICATION NO. | : 12/547418 | |
| DATED | : January 29, 2013 | |
| INVENTOR(S) | : Durbin et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 433 days.

Signed and Sealed this
Eleventh Day of November, 2014

Michelle K. Lee
*Deputy Director of the United States Patent and Trademark Office*